United States Patent
Horie et al.

(10) Patent No.: US 10,551,442 B2
(45) Date of Patent: Feb. 4, 2020

(54) BATTERY DIAGNOSIS DEVICE AND BATTERY PACK

(71) Applicant: HITACHI KOKI CO., LTD., Tokyo (JP)

(72) Inventors: Yuki Horie, Ibaraki (JP); Takao Aradachi, Ibaraki (JP); Kazuhiko Funabashi, Ibaraki (JP)

(73) Assignee: KOKI HOLDINGS CO., LTD., Tokyo (JP)

( * ) Notice: Subject to any disclaimer, the term of this patent is extended or adjusted under 35 U.S.C. 154(b) by 168 days.

(21) Appl. No.: 15/580,275

(22) PCT Filed: Aug. 10, 2016

(86) PCT No.: PCT/JP2016/073598
§ 371 (c)(1),
(2) Date: Dec. 7, 2017

(87) PCT Pub. No.: WO2017/043248
PCT Pub. Date: Mar. 16, 2017

(65) Prior Publication Data
US 2018/0143256 A1    May 24, 2018

(30) Foreign Application Priority Data

Sep. 11, 2015    (JP) .................................. 2015-179688

(51) Int. Cl.
*G01R 31/00* (2006.01)
*G01R 31/387* (2019.01)
(Continued)

(52) U.S. Cl.
CPC ....... *G01R 31/387* (2019.01); *G01R 31/3648* (2013.01); *H01M 10/425* (2013.01);
(Continued)

(58) Field of Classification Search
USPC ......................................... 324/426, 432–434
See application file for complete search history.

(56) References Cited

U.S. PATENT DOCUMENTS

| 2012/0182132 A1 | 7/2012 | McShane et al. |
| 2014/0095656 A1* | 4/2014 | Brandal .................. H04Q 9/00 709/217 |
| 2014/0210265 A1* | 7/2014 | Thorsoe ................. H02J 7/0011 307/23 |

FOREIGN PATENT DOCUMENTS

| EP | 2819267 | 12/2014 |
| JP | 2001283931 | 10/2001 |

(Continued)

OTHER PUBLICATIONS

"International Search Report (Form PCT/ISA/210) of PCT/JP2016/073598", dated Oct. 4, 2016, with English translation thereof, pp. 1-6.

(Continued)

*Primary Examiner* — Vincent Q Nguyen
(74) *Attorney, Agent, or Firm* — JCIPRNET

(57) ABSTRACT

In order to enable easy determination of whether a battery pack possessed by a user is one to be guaranteed or not and clearly differentiate an old battery pack from a new battery pack not to allow the old battery pack to be used in the field, when a battery diagnosis device determines that the battery pack is one to be guaranteed, information held by the diagnosed battery pack is written into a second battery pack different from the diagnosed battery pack.

9 Claims, 5 Drawing Sheets

(51) Int. Cl.
*H01M 10/48* (2006.01)
*H01M 10/42* (2006.01)
*G01R 31/36* (2019.01)
*H02J 7/00* (2006.01)

(52) U.S. Cl.
CPC ....... *H01M 10/4285* (2013.01); *H01M 10/48* (2013.01); *H01M 10/482* (2013.01); *H01M 2010/4278* (2013.01); *H01M 2220/30* (2013.01); *H02J 7/0042* (2013.01); *H02J 2007/004* (2013.01); *H02J 2007/0037* (2013.01); *H02J 2007/0098* (2013.01)

(56) References Cited

FOREIGN PATENT DOCUMENTS

| | | |
|---|---|---|
| JP | 2002124304 | 4/2002 |
| JP | 2012133903 | 7/2012 |
| JP | 2013024725 | 2/2013 |
| JP | 2013255965 | 12/2013 |
| WO | 2007128876 | 11/2007 |

OTHER PUBLICATIONS

"Search Report of Europe Counterpart Application", dated Jan. 29, 2019, p. 1-p. 9.

\* cited by examiner

| Items | Serial number | Details |
|---|---|---|
| Intrinsic information | 1 | Battery information (battery voltage/battery capacity /connection/others) |
| | 2 | Manufacturing date/manufacturing factory |
| Handover information | 3 | Total number of times of charging |
| | 4 | Guarantee end date (information of old battery pack to be handed over) |
| | 5 | Number of times of supply |
| Number-of-times information | 6 | Discard flag |
| | 7 | Number of times of charging |
| | 8 | Number of times of excess discharging |
| | 9 | Number of times of excess charging |
| | 10 | Number of high temperature instances |
| | 11 | Number of times long-time-left |
| | 12 | Others |

FIG. 2

103,303: adaptor recognition
104,304,207,307: information transmission
105,305,208,308: information reception
206,306: power supply 5V
310,311: level converter 106: battery set
107: battery protection IC
109: step-down circuit
108: microcomputer

BATTERY DIAGNOSIS DEVICE AND BATTERY PACK

CROSS-REFERENCE TO RELATED APPLICATION

This application is a 371 application of the International PCT application serial No. PCT/JP2016/073598, filed on Aug. 10, 2016, which claims the priority benefits of Japan Patent Application No. 2015-179688, filed on Sep. 11, 2015. The entirety of each of the above-mentioned patent applications is hereby incorporated by reference herein and made a part of this specification.

BACKGROUND OF THE INVENTION

Field of the Invention

The invention relates to a battery diagnosis device for diagnosing a battery pack and a battery pack.

Background Art

Managers of stores and the like generally determine whether battery packs are within a guarantee period based on letters of guarantee accompanying the battery packs. In addition, battery packs can be returned from circulation (users) to stores and the like when necessary for reasons of a defect, and the like (e.g., a reduced battery capacity or the like). When returned, normally such battery packs are replaced in response to a request from a user.

CITATION LIST

Patent Literature

Patent Literature 1
Japanese Unexamined Patent Application Publication No. 2001-283931

BRIEF SUMMARY OF THE INVENTION

Technical Problem

However, it is inconvenient for managers to check the letters of guarantee in order to determine whether products are within guarantee periods. In addition, there is concern that managers may mix together returned battery packs (which will be referred to as old battery packs below) and battery packs to be used for replacement (which will he referred to as new battery packs) and thus old battery packs mistakenly circulating on the market. Furthermore, if an old battery pack is replaced with a new battery pack within a guarantee period, there is concern of information of the old battery back and the new battery pack (usage information) not being managed in association with a specific user.

The invention has been conceived to solve the above-described problems and thus aims to enable whether a battery pack possessed by a user is to be guaranteed to be easily determined. The invention also aims to enable old battery packs to be clearly differentiated from new battery packs and thus to make the old battery packs unusable on the market. In addition, the invention aims to enable a battery pack used by a specific user to be more reliably managed.

Solution to Problem

For the purpose of achieving the above-described objectives, the invention provides a battery diagnosis device which diagnoses a state of a battery pack that serves as a power source of a cordless electronic device and can be charged by a charger, the battery diagnosis device characterized in writing information held by the battery pack into a second battery pack that is different from the aforementioned battery pack.

In addition, the invention is a battery diagnosis device which diagnoses a state of a battery pack that serves as a power source of a cordless electronic device and can be charged by a charger, the battery diagnosis device characterized in determining whether the battery pack is to be guaranteed.

Furthermore, the invention is a battery diagnosis device which diagnoses a state of a battery pack that serves as a power source of a cordless electronic device and can be charged by a charger, the battery diagnosis device characterized in setting a battery pack to disable use of a cordless electronic device or a charger even if the battery pack is connected to the cordless electronic device or the charger after the battery pack is diagnosed.

Advantageous Effects of Invention

According to the invention, it is possible to easily determine whether a battery pack possessed by a user is to be guaranteed. In addition, an old battery pack and a new battery pack can be clearly differentiated, and the old battery pack can be prevented from being available on the market. Furthermore, a battery pack used by a specific user can be more reliably managed.

BRIEF DESCRIPTION OF THE SEVERAL VIEWS OF THE DRAWING(S)

FIG. 2 is an example of a diagram illustrating information held by a battery pack.

DETAILED DESCRIPTION OF THE INVENTION

Figure 1:
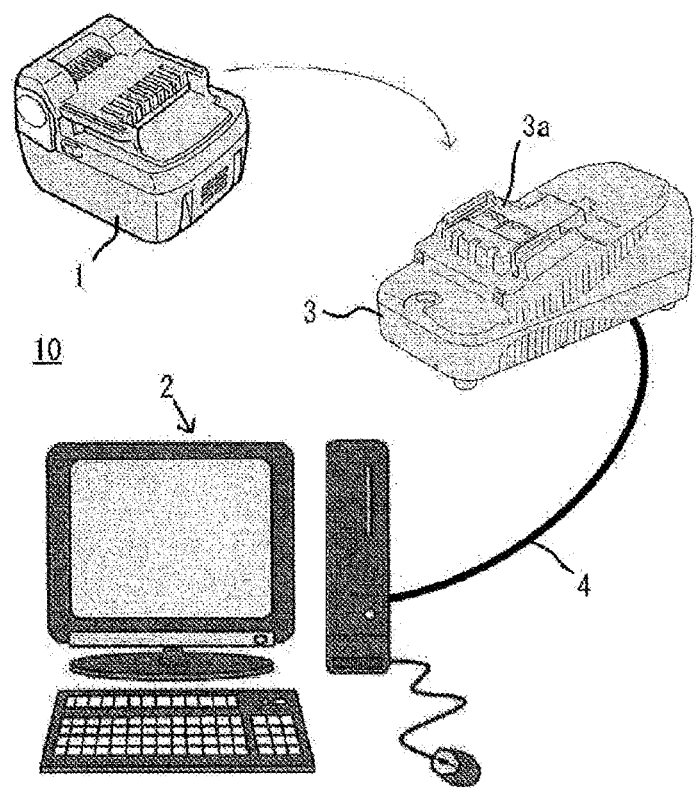
FIG. 1 is an example of a configuration diagram illustrating a battery diagnosis device according to the invention.

An embodiment of the invention will be described below with reference to the drawings. As illustrated in FIG. 1, a battery diagnosis device (a battery diagnosis system) 10 is mainly constituted by a battery pack 1, an adaptor 3 in the same shape as a charger having a mounting unit 3a on which the battery pack 1 is mounted, and a computer device 2 that is connected to the adaptor 3 via a cable 4.

In the battery diagnosis device 10, the adaptor 3 is connected to the computer device 2 via the cable 4 with the battery pack 1 mounted on the adaptor 3. Then, an application of the computer device 2 is activated and executed. Note that the battery pack 1, the adaptor 3, and the computer device 2 may be connected to each other in any order.

When the application of the computer device 2 is executed, the battery pack 1 and the computer device 2 exchange information held by the battery pack 1 via the adaptor 3 and the cable 4. The computer device 2 determines whether the battery pack 1 is to be managed based on this information, and a result of the determination is displayed in the computer device 2. Details thereof will be described below.

Here, content of the information held by the battery pack 1 will be described using FIG. 2. The battery pack 1 holds three kinds of information broadly. First information is intrinsic information included in the battery pack 1 since its release from a factory, the information including battery information indicating a nominal battery voltage of the battery pack 1 or battery cells, a nominal battery capacity of the battery pack 1 or the battery cells, a connection form of the battery cells (the number of serial/parallel connections of the battery cells) and the like (serial number 1), and manufacturing information indicating the date of manufacturing and the manufacturing factory (serial number 2).

Second information is handover information including the total number of times of charging that is the cumulative number of times of charging of an old battery pack and a new battery pack (a total number of times of charging; serial number 3), a guarantee end date which is information handed over from an old battery pack (serial number 4), and the number of times of supply of a new battery pack (serial number 5). Note that, with regard to the number of times of charging, the total number of times of charging is recorded to ascertain how many times a certain user has charged the battery pack 1. In addition, a guarantee end date is a date after a predetermined period of time from a guarantee start date which is a purchase date of an old battery pack and the guarantee start date is not reset even when an old battery pack is replaced with a new battery pack.

Third information is number-of-times information indicating usage histories such as a discard flag, the number of times of charging, the number of times of excess discharging, the number of times of excess charging, the number of high temperature instances, and the number of times of long-time-left (serial numbers 6 to 12). Note that the number of times of discharging may also be recorded. Serial number 12 is information including, for example, the number of times of charging after excess charging, or the like. The discard flag is a flag indicating that it has been determined that a battery should be discarded when it is returned from the market (a user) to a store (a manufacturer) and determined that its life is over (e.g., when a discharge capacity thereof is equal to or lower than half of a nominal capacity or the like), or that a battery cell has been determined to be abnormal (e.g., when a battery cell has been excessively charged because it has mostly been used heavily for a heavy load tool and cell balance for a battery voltage has broken, or the like), and thus a battery pack 1 having this discard flag is no longer available as will be described below. Note that, even if a discharging capacity is smaller than a nominal capacity, when no abnormality is found in a battery, and life still remains even though the battery has deteriorated a little, an old battery pack may be returned to the user as it is.

The number of times of charging is the number of times the battery pack 1 has been charged by a charger, the number of times of excess discharging is the number of times, when the battery pack 1 has been used for a cordless electronic tool or the like, a voltage of the battery pack 1 (battery cells) has been lower than a predetermined threshold value (a threshold value of excess discharge) and thus the battery pack has been in an excessively discharged state, the number of times of excess charging is the number of times, after the battery pack 1 has been charged by a charger, a voltage of the battery pack 1 (battery cells) has exceeded a predetermined threshold value (a threshold value of excess charge) and thus the battery pack has been in an excess charging state, the number of high temperature instances is the number of times the battery pack 1 has had a high temperature when it had to be charged such it is not possible to start charging, and the number of times of long-time-left is the number of times the battery pack has been excessively discharged, which is also the counted number of times when the battery pack has stopped due to excess discharging that occurred in a previous discharging but has been left without being charged, then has been connected to a cordless electronic device or a charger to activate a microcomputer 108, which will be described below, but its battery voltage was low (e.g., 2 V per battery cell which is lower than the threshold value of excess discharge).

Figure 3:
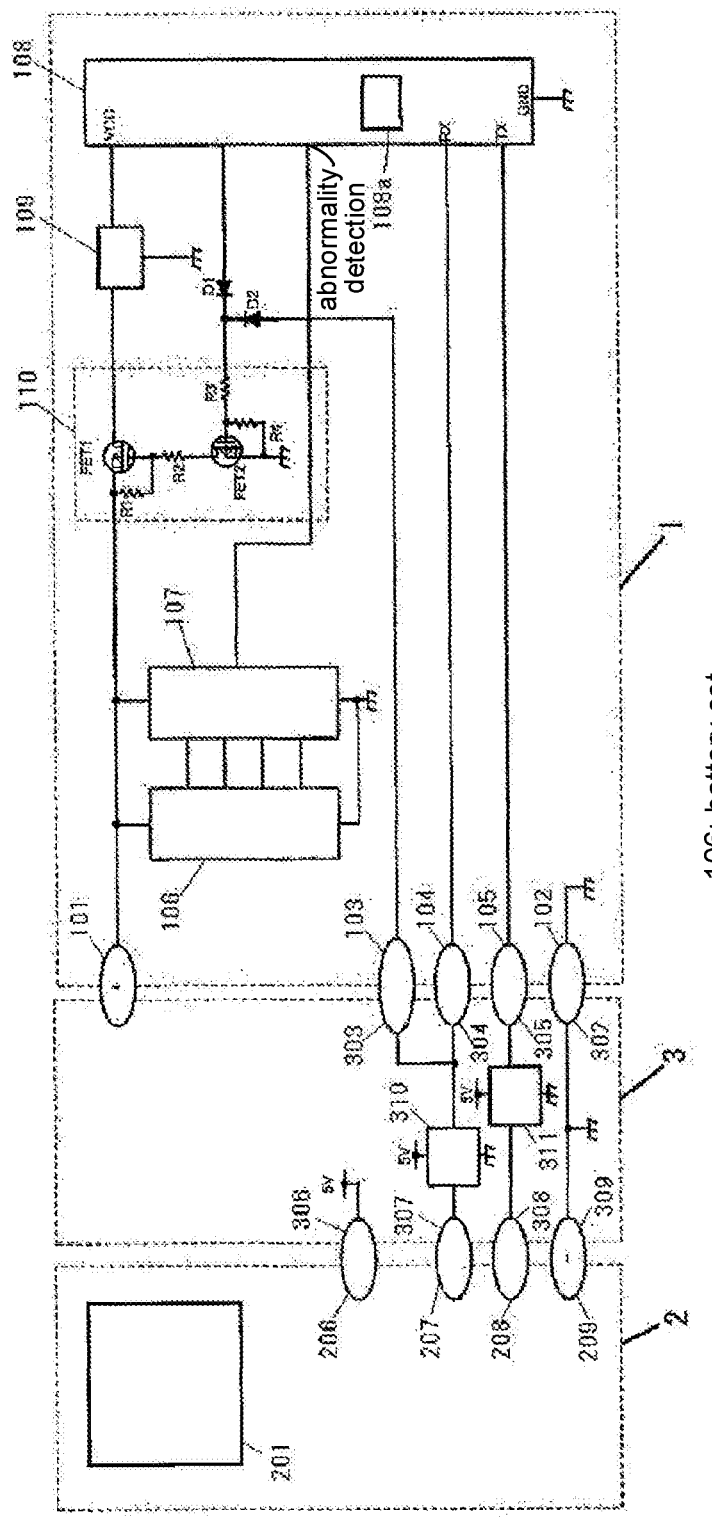
FIG. 3 is an example of a circuit diagram illustrating the battery diagnosis device according to the invention.

Next, a circuit configuration of the battery diagnosis device 10 will be described using FIG. 3. The battery pack 1 is a battery pack used for a cordless electronic device (e.g., an electric tool such as an impact driver or an electronic device such as a radio), which includes an output plus terminal 101 and an output minus terminal 102, an adaptor recognition terminal 103 that receives information of whether the device is connected to the adaptor 3, an information reception terminal 104 that receives information from the computer device 2, and an information transmission terminal 105 that transmits information of the battery pack 1 to the computer device 2. Note that the battery pack 1 can be charged by being connected to a charger having the same shape as the mounting unit 3a of the adaptor 3.

The battery pack 1 includes a battery set 106 that is constituted by one or a plurality of connected battery cells formed of, for example, lithium ion batteries (secondary batteries), a protection IC 107 that monitors cell voltages of the respective battery cells constituting the battery set 106 and outputs an abnormality signal when a battery cell shows an abnormal operation (excessive charging, excessive discharging, etc.), the microcomputer 108 that serves as a control unit that controls transmission of information of the battery pack 1, reception of information from the computer device 2, and the like, a step-down circuit 109 that transforms a voltage of the battery set 106 into a driving voltage of the microcomputer 108, and a microcomputer activation unit 110 that activates the microcomputer 108 and maintains an activated state of the microcomputer 108. In addition, the battery pack 1 has a predetermined nominal voltage (e.g., 14.4 V in a case in which four battery cells having 3.6 V are connected in series) and a predetermined battery capacity (e.g., 3.0 Ah in a case in which battery cells are connected in parallel, and 6.0 Ah in a case in which two battery cells are connected in parallel). The above-described unique information and each piece of information are stored in a storage unit 108a of the microcomputer 108.

The microcomputer activation unit 110 includes two FETs 1 and 2, and resistors R1 to R4. The FET2 enters an on-state when one (a high level signal) of a signal input from the microcomputer 108 via a diode D1 and a signal input from the adaptor recognition terminal 103 via a diode D2 is input to a gate terminal of the FET2. When the FET2 is on, a voltage difference is created between a gate and a source of the FET1 (it should be noted that the gate and the source have the same potential when the FET2 is off) and thus the FET1 enters an on-state. As a result, a battery voltage of the battery set 106 is supplied to the step-down circuit 109 via the FET1. The battery voltage is stepped down to, for example, 5 V by the step-down circuit 109, and supplied to a power supply terminal VCC of the microcomputer 108 as a power supply voltage.

That is, when the battery pack 1 is connected to the adaptor 3 that is connected to the computer device 2, a signal output from the computer device 2 is input to the battery pack 1 as a high level signal via the adaptor recognition terminal 103. This high level signal is input to the microcomputer activation unit 110 via the diode D2, then the microcomputer activation unit 110 operates to switch on the FET1, and thereby a power supply voltage is supplied to activate the microcomputer 108. Once the microcomputer 108 is activated, the microcomputer 108 outputs a high level signal from an output port thereof. This high level signal is input to the microcomputer activation unit 110 via the diode D1, thus the FET1 can maintain the on-state, and thereby supply of the power supply voltage to the microcomputer 108 can be maintained.

The battery pack 1 monitors states of respective battery cells using the protection IC 107. For example, when one or some of the plurality of battery cells are abnormal (e.g., in an excessively discharged state or an excessively charged state), an abnormality signal (a high level signal) is output to the microcomputer 108. When the microcomputer 108 receives an input of the abnormality signal to an abnormality detection terminal thereof, the microcomputer increments the number of abnormalities that corresponds to the number-of-times information shown in FIG. 2 and causes the information to be stored in the storage unit 108a. Note that the battery pack 1 (the microcomputer 108 or the protection IC 107) outputs the abnormality signal to the cordless electronic device or the charger to prohibit use of the battery pack 1.

In addition, the microcomputer 108 has an RX terminal to which information received from the computer device 2 is input via the information reception terminal 104, a TX terminal which transmits information held by the battery pack 1 to the computer device 2 via the information transmission terminal 105, and a GND terminal through which the microcomputer is connected to a ground.

The adaptor 3 includes an adaptor recognition terminal 303, an information reception terminal 304, an information transmission terminal 305, and a minus terminal 302 for being connected to each of the adaptor recognition terminal 103, the information reception terminal 104, the information transmission terminal 105, and the minus terminal 102 of the battery pack 1. In addition, the adaptor further includes a power supply terminal 306, an information transmission terminal 307, an information reception terminal 308, and a minus terminal 309 for being connected to each of terminals of the computer device 2, which will be described below.

The adaptor 3 includes a first level converter 310 provided on a connection line of the information transmission terminal 307 and the information reception terminal 304, and a second level converter 311 provided on a connection line of the information reception terminal 308 and the information transmission terminal 305. These level converters 310 and 311 receive supply of 5 V of power via the power supply terminal 306 from the computer device 2. Furthermore, the adaptor recognition terminal 303 branches off from the connection line of the information transmission terminal 307 and the information reception terminal 304. That is, the adaptor recognition terminal 303 is connected to the information transmission terminal 307 and the information reception terminal 304.

The computer device 2 includes a power supply terminal 206, an information transmission terminal 207, the information reception terminal 208, and a minus terminal 209 for being connected to each of the power supply terminal 306, the information transmission terminal 307, the information reception terminal 308, and the minus terminal 309 of the adaptor 3. The terminals 206 to 209 on the computer device 2 side and the terminals 306 to 309 on the adaptor 3 side are connected via the cable 4. In addition, a display unit (a display) 201 that displays diagnosis results of the battery pack 1, which will be described below, is included. Note that, although the computer device 2 is connected to the adaptor 3 via the power supply terminal 306, the information transmission terminal 307, the information reception terminal 308, and the minus terminal 309 in the present embodiment, the adaptor 3 and the computer device 2 may be connected via a USB terminal by installing, for example, a USB-serial conversion cable in the adaptor 3.

Next, communication between the battery pack 1 and the computer device 2 will be described. By connecting the information reception terminal 104 of the battery pack 1 to the information transmission terminal 207 of the computer device 2 and the information transmission reception terminal 105 of the battery pack 1 to the information reception terminal 208 of the computer device 2 respectively via the first and second level converters 310 and 311, the battery pack 1 and the computer device 2 can communicate with each other.

A communication signal is a high level signal or a low level signal, and the high level signal and the low level signal are configured to be converted by the level converters 310 and 311 provided in the present embodiment. For example, when a high level signal is output from the TX terminal of the microcomputer 108 of the battery pack 1, the high level signal is output to the information transmission terminal 105 of the battery pack 1. This high level signal is converted into a low level signal by the second level converter 311 of the adaptor 3 and transmitted to the information reception terminal 208 of the computer device 2. A signal input to the RX terminal of the microcomputer 108 is transmitted in a similar manner.

When the information reception terminal 104 and the information transmission terminal 105 of the battery pack 1 are shared as a terminal for charging control when the battery pack is connected to and charged by a charger (e.g., a terminal for outputting an abnormality signal to the charger when the battery pack is abnormal) and a terminal for performing discharge control when the battery pack is connected to and discharged by a cordless electronic device (e.g., a terminal for outputting an abnormality signal to the device when the battery pack is abnormal), it is necessary to convert levels of the signals in accordance with a configuration of the battery pack 1 and specifications of the microcomputer 108. The two level converters 310 and 311 are provided in the adaptor 3 on the assumption of the above-described case in the present embodiment. Note that it is not necessary to provide the first and second level converters 310 and 311 in cases in which there is no need to convert levels of communication signals. In addition, when a power supply voltage of the microcomputer 108 of the battery pack 1 is, for example, 3.3 V, rather than 5 V, there is a difference in power supply voltages between the computer device 2 and the power of 5 V of the adaptor 3, and thus a level converter needs to be provided in the battery pack 1.

Figure 4:
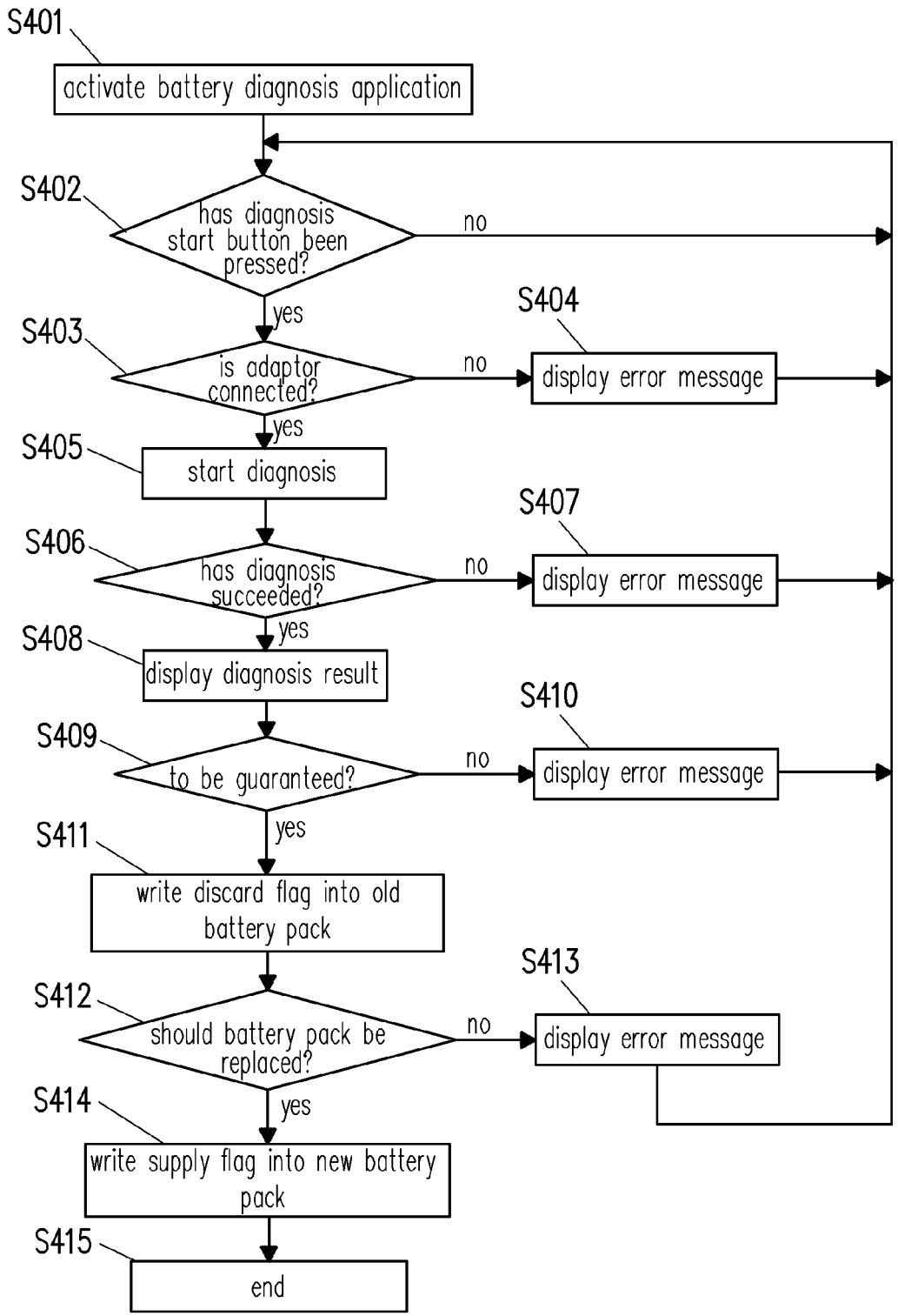
FIG. 4 is an example of a flowchart with respect to control of the battery diagnosis device according to the invention.

Next, a series of operations of the battery diagnosis device 10 according to the present embodiment will be described using the flowchart of FIG. 4 and an example of an application screen showing a diagnosis result of FIG. 5A, FIG. 5B and FIG. 5C. First, a manager of a store or the like connects the battery pack 1 and the computer device 2 using the adaptor 3 and the cable 4. Here, the battery pack 1 used in battery diagnosis is assumed to be a battery pack 1 having a small battery capacity (e.g., equal to or smaller than 50% of a nominal capacity) or having a short or defective life.

Figure 5A:
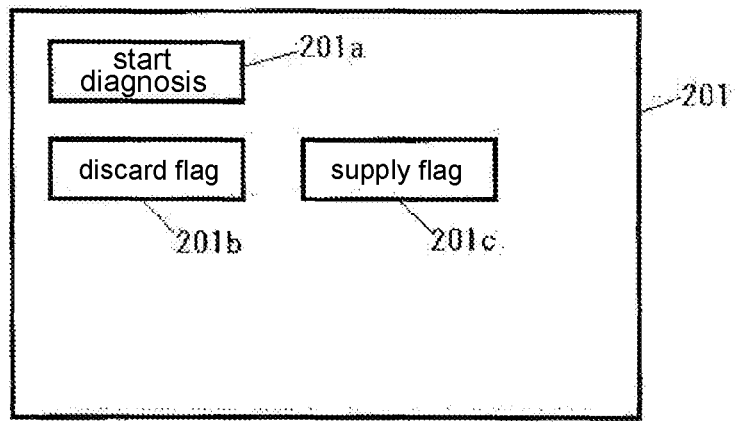
FIG. 5A, FIG. 5B and FIG. 5C are examples of screens of an application showing diagnosis results of the battery diagnosis device according to the invention.

Next, when an application of the computer device 2 corresponding to the battery diagnosis is activated (S401), a screen shown in FIG. 5A is displayed on the display unit 201. The screen displays a diagnosis start button 201a, and a discard flag button 201b and a supply flag button 201c which will be described below. When the manager inputs the purchase date of the battery pack 1 onto the display unit 201 and presses the diagnosis start button 201a of the application (S402), it is checked (determined) whether the computer device 2 is connected to the adaptor 3 (S403). When the diagnosis start button 201a is pressed, the computer device 2 outputs a predetermined signal to the RX terminal of the microcomputer 108 of the battery pack 1 from the information transmission terminal 207. Upon receiving the signal, the microcomputer 108 outputs a signal from the TX terminal to the computer device 2 to inform the computer device of the fact that the predetermined signal has been received. With this communication, a connection to the adaptor 3 is confirmed.

When no connection to the adaptor 3 is determined in S403 (No in S403), no communication is possible between the battery pack 1 and the computer device 2. That is, no signal to inform the computer device 2 of the fact that the signal has been received is input from the battery pack 1 side to the computer device 2. Thus, diagnosis is not possible, an error message is displayed on the display unit 207 of the computer device 2 (S404), the process returns to S402, and thus an initial display of the application is shown.

On the other hand, when connection to the adaptor 3 is determined in S403 (Yes in S403), battery diagnosis starts (S405). The computer device 2 (the application) reads information (content) held by the battery pack 1 shown in FIG. 2 from the battery pack 1. That is, when the battery diagnosis starts, a battery diagnosis start signal is output from the information transmission terminal 207 of the computer device 2 to the RX terminal of the microcomputer 108 of the battery pack 1. When the microcomputer 108 receives this signal, held information of the battery pack 1 shown in FIG. 2 is output from the TX terminal to the information reception terminal 208 of the computer device 2. The computer device 2 stores the held information of the battery pack 1.

For example, the microcomputer 108 of the battery pack 1 outputs information held by the battery pack 1 shown in FIG. 2 from the TX terminal to the computer device 2 as predetermined signals in order of the serial numbers. Here, the predetermined signals include signals varying according to the serial numbers (information to be transmitted), and may be signals with a high level and a low level having different cycles (e.g., in the case of the serial number 1, signals with a high level and a low level changing in a first cycle, in the case of serial number 2, signals changing in a second cycle, and the like), or signals with a high level and a low level in different order (e.g., in the case of the serial number 3, signals with a high level and a low level changing in an alternating manner, and in the case of the serial number 4, signals output with a high level two consecutive times and then with a low level, or the like). The computer device 2 can determine what information has been received (input) with the different signals. In addition, as another method, the computer device 2 and the battery pack 1 may communicate with each other for each of the serial numbers. For example, the computer device 2 may output a predetermined signal corresponding to necessary information from the information shown in FIG. 2 to the battery pack 1. The battery pack 1 can determine information needed for the computer device 2 with the signals, and the battery pack may output the corresponding information to the computer device 2. Communication can be performed for each of the serial numbers by performing second and succeeding communication operations after a first communication operation is finished. Note that the communicated information of the battery pack 1 is stored in a storage unit of the computer device 2.

Figure 5B:
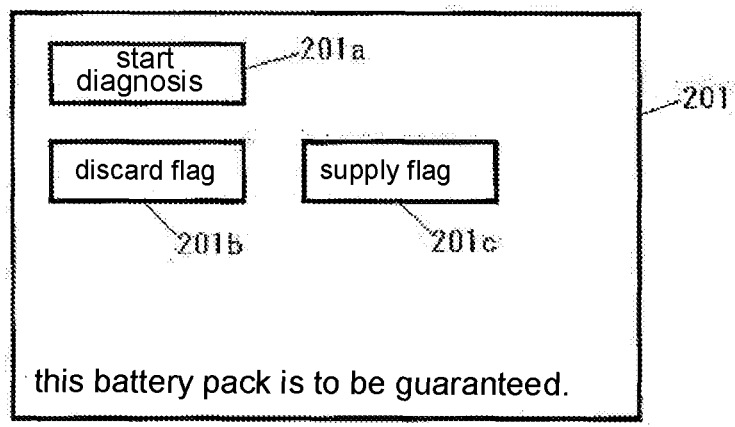
Figure 5C:
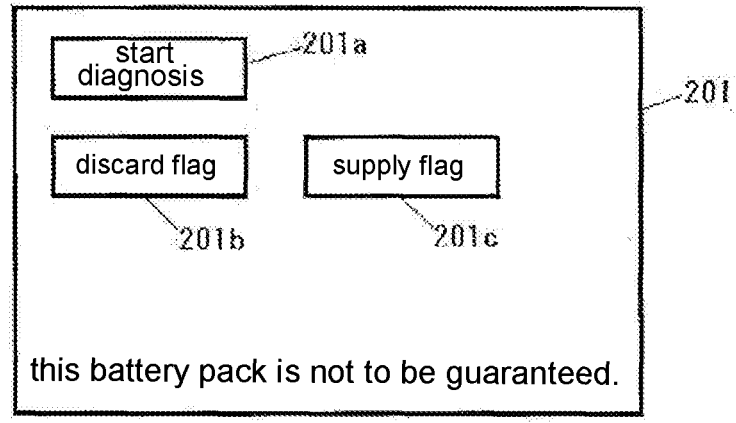

When the communication between the battery pack 1 and the computer device 2 succeeds and reading of the information held by the battery pack 1 succeeds, the diagnosis succeeds as well (Yes in S406), and a diagnosis result of the battery pack 1 is displayed on the display unit 201 of the computer device 2 as illustrated in FIG. 5B or FIG. 5C (S408). Meanwhile, when the communication fails for any reason (e.g., a defective contact between terminals, a disconnection of a communication line, or the like) (No in S406), an error message is displayed on the display unit 201 of the computer device 2 (S407), the process returns to S402, and the initial display of the application is shown.

Although only a message "to be guaranteed" or "not to be guaranteed" is displayed on the display unit 201 as a diagnosis result in the present embodiment, any information held by the battery pack 1 shown in FIG. 2 may be displayed. Whether the battery pack is to be guaranteed or not can be determined based on, for example, the total number of times of charging, the date of manufacturing, or the like. Here, cases of the battery pack to be guaranteed include, for example, a case in which the total number of times of charging indicating a use state of the battery pack 1 of a certain user (the total number of times of charging of an old battery pack and a new battery pack) is no more than a predetermined number of times (e.g., no more than 1500 times), a case in which the number of times of supply an old battery pack has been replaced with a new battery pack is within a predetermined number of times, for example, no more than 5 times, based on handover information or number-of-times information, and a case of being within a predetermined period (within a guarantee period) from the purchase date of the battery pack 1 (cordless electronic device) or the date of manufacturing based on intrinsic information with regard to the date of manufacturing or the manufacturing factory. Note that the total number of times of charging may be the number of times guaranteed by the manufacturer on a catalog or the like. In this case, if a battery capacity of the old battery pack decreases before the number of guaranteed times runs out, the above-described information may be handed over to the new battery pack, and guarantee may be provided until the total number of times reaches the number of guaranteed times. In addition, the purchase date is recorded as the manager inputs the date written in the letter of guarantee into the application when battery diagnosis starts.

Here, since the diagnosis result is displayed on the display unit 201 of the computer device 2 as the information shown in FIG. 5B or FIG. 5C or the above-described information held by the battery pack 1, the manager (of the store) can easily ascertain a state of the battery pack 1. In S409, when the diagnosed battery pack 1 is to be guaranteed (Yes in S409), the manager collects the diagnosed battery pack 1 (the old battery pack) and replaces the old one with a battery pack 1 (a new battery pack) to give the new battery pack to the user. On the other hand, when the battery pack is not to be guaranteed (No in S409), the display unit 201 displays the information shown in FIG. 5C or an error message (S410), the process returns to S402, and the initial display of the application is shown. In this case, the manager may collect the old battery pack if necessary, but does not give a new battery pack to the user.

In the case of "to be guaranteed," the discard flag is written in the old battery pack 1 (S411). Specifically, when the discard flag button 201b is pressed, the application outputs a predetermined signal from the information transmission terminal 207 of the computer device 2 to the RX terminal of the microcomputer 108. Upon receiving this signal, the microcomputer 108 writes the discard flag in the storage unit 108a, and outputs a predetermined signal indicating that the discard flag has been written from the TX terminal. By receiving this signal, the computer device 2 determines that the discard flag writing process is finished. The discard flag is written in the diagnosed old battery pack through this operation, however, if an old battery pack has erroneously circulated on the market, the manager can recognize the old battery pack in which the discard flag has been written after the application made a diagnosis, and thus can save replacement of an extra battery pack 1. In addition, if the discard flag is written in the battery pack 1, use of the battery pack 1 on the market can be prevented by prohibiting the battery pack from being charged and discharged. If charging and discharging is not prohibited, there is concern of a replaced new battery pack of being in an abnormal state such as having a short usage time (a short dischargeable time or a small number of times of charging) or a short life. Such an abnormal state can be prevented by prohibiting charging and discharging.

In order to prohibit charging and discharging, the battery pack 1 outputs a signal to a counterpart device (a device or a charger) using the information reception terminal 104 and the information transmission terminal 105 of the battery pack 1. When the battery pack 1 is connected to a charger, one of the information reception terminal 104 and the information transmission terminal 105 can be used as a battery abnormality signal terminal, and if an abnormality signal (e.g., an excess charging signal) of the battery pack 1 is continuously output to a terminal of the charger connected to the aforementioned terminal, a microcomputer of the charger may determine an abnormality of the battery and may not perform charging. Meanwhile, when the battery pack 1 is connected to a cordless electronic device, the other one of the information reception terminal 104 and the information transmission terminal 105 can be used as a battery abnormality signal terminal, and if an abnormality signal (e.g., an excess discharge signal) of the battery pack 1 is continuously output to a terminal of the charger connected to the aforementioned terminal, a switching element, for example, provided on a discharge path may be switched off so as not to enable discharging. In addition, a terminal to be connected to an electronic device and a charger may be provided independently of the information reception terminal 104 and the information transmission terminal 105 to cause an abnormality signal to be output from the terminal. Furthermore, in a case in which a switching element is provided on a charging/discharge path on the battery pack 1 side, if a switching element of the battery pack 1 is switched off using an abnormality signal, charging and discharging can be disabled. Alternatively, both the switching elements may be switched off. In addition, use of the battery pack 1 may be prohibited by performing communication between the microcomputer 108 of the battery pack 1 and a microcomputer of the electronic device or the charger. Note that an abnormality signal may not be continuously output but may be periodically (regularly) output as long as the connected counterpart device is not driven. With the above-described configurations, the collected battery pack does not operate even if it is connected to the counterpart device, and thus the battery pack can be reliably determined as having been collected with no waste of time.

After the discard flag is written in the old battery pack 1, a process of writing the supply flag in the new battery pack is performed. Since the old battery pack is connected to the adaptor 3 in the state of S411, it is necessary to replace the battery pack connected to the adaptor 3 with a new battery pack. If the old battery pack is still connected to the adaptor 3 or the battery pack is not connected to the adaptor 3 in S412 (No in S412), an error message to prompt a connection of the new battery pack is displayed on the display unit 201 (S413). In the case in which the old battery pack is still connected thereto, battery pack information transmitted from the battery pack coincides with information stored in the computer device 2 through communication, and thus it can be determined that replacement with the new battery pack has not been performed. In addition, when the battery pack is not connected thereto, it can be determined that no signal from the battery pack is input.

The old battery pack in which the discard flag is written and the new battery pack have different information which is held by the battery packs (e.g., the intrinsic information shown in FIG. 2). Thus, if the old battery pack has been replaced with the new battery pack, battery pack information input from the battery pack to the computer device 2 (e.g., a serial number that is intrinsic information) does not coincide with information of the old battery pack stored in the computer device 2. Thus, when the stored battery pack information does not coincide with newly received information in S412 (Yes in S412), the application determines that replacement with the new battery pack has been performed, and the process proceeds to S414. Although the application automatically determines the replacement of the battery pack in the present embodiment, determination may be made manually. Specifically, a battery replacement button may be provided in the display unit 201 and the button can be operated when a battery pack is replaced.

In S414, the supply flag is written in the new battery pack. Specifically, when the supply flag button 201c shown in FIG. 5A, FIG. 5B and FIG. 5C is pressed, a predetermined signal is output from the information transmission terminal 207 of the computer device 2 to the RX terminal of the microcomputer 108. Upon receiving this signal, the microcomputer 108 writes the supply flag in the storage unit 108a, and outputs a predetermined signal indicating that the supply flag has been written from the TX terminal. By receiving this signal, the computer device 2 determines that the process of writing the supply flag has ended. Further, in S414, the information regarding the old battery pack output from the old battery pack and stored in the computer device 2 is handed over to (stored in) the new battery pack. A communication method between the computer device 2 and the new battery pack may be the same as the above-described method. After the new battery pack stores the information regarding the old battery pack, it outputs a signal from the TX terminal, the computer device 2 receives this signals, and thereby the battery diagnosis process finishes (S415). Note that, in a case in which the handover has not been performed normally due to a defective contact between terminals, an error message may be displayed as in S407 or the like.

By comparing pieces of the information held by the old battery pack and the new battery pack with each other through the above-described operation, replacement of the battery pack can be clearly ascertained, and erroneous writing of the discard flag or the supply flag can be prevented. In addition, if pieces of the battery information that are intrinsic information (a nominal battery voltage, a nominal capacity, etc.) are compared and the battery pack is replaced when the pieces coincide with each other, rather than simply determining whether the battery pack has been replaced in S412, a new battery pack having the same specifications as the old battery pack can be handed over to the user.

In addition, when the supply flag is written in the new battery pack, by not only counting the number of supply operations with respect to a certain user but also handing over information of the old battery pack such as the number of times of charging from the old battery pack, a manager can ascertain use information with respect to the user such as the total number of times of charging of the old battery pack and the new battery pack even when the old battery pack has been replaced with a new battery pack, can determine whether the battery pack is to be guaranteed based on the total number of times of charging, and thus can prevent useless replacement of a battery pack.

In addition, if the battery purchase date is input to the application when battery diagnosis starts, the date on which the battery pack was first purchased, i.e., the guarantee start date, can be recorded. Since the battery purchase date is written in the letter of guarantee at the store when the battery pack is purchased, the date may be input after the letter of guarantee is checked. In a case of a user for whom battery diagnosis (replacement of a battery) has been performed once, a new battery pack has taken over information of the guarantee end date (guarantee period) from the old battery pack, and thus the guarantee period can be ascertained even if the letter of guarantee is lost, and whether the battery pack is to be guaranteed can be determined. Note that, if the letter of guarantee is lost when first battery diagnosis is about to be performed, a guarantee period can be set based on the manufacturing date from intrinsic information shown in FIG. 2. In this case, a longer period (e.g., 3 years) than the guarantee period (e.g., 2 years) from the purchase date may be set.

Furthermore, as the information is handed over from the old battery pack to the new battery pack, the new battery pack can be provided to the user as long as a period guaranteed by the manufacturer or a predetermined condition (e.g., the number of times of charging) is satisfied. In addition, by handing over the user information (e.g., the number of times of charging, etc.) of the battery pack 1, a style of use of the user can be analyzed, and advice on how the battery pack 1 can be used for longer can be provided. Moreover, if user information (e.g., user name, password, etc.) can be registered at a time of first battery diagnosis, the user can be identified, and there is no need for re-registration thereafter due to handing over user information, and thus a burden imposed on the user can be reduced.

Although only the battery pack collected by the manager is made unusable in the present embodiment, a battery pack not to be guaranteed may be set to be unusable. For example, if the number of times of charging or the number of times of discharging is high, there is a possibility of a capacity being lowered, an operation time being short, and the balance between the battery cells being broken, and thus the battery cells gradually deteriorate. Thus, the numbers of times of charging and discharging are set as criteria of a life and if the numbers of times exceed a predetermined number of times, a life of the battery pack may be regarded as having run out and it can be set to be unusable.

The invention claimed is:

1. A battery diagnosis device that diagnosis a state of a battery pack that serves as a power source of a cordless electronic device and is charged by a charger, the battery diagnosis device comprises:

an adaptor having a mounting unit on which the battery pack is mounted, and
a computer device that is connected to the adaptor, the computer device having a storage unit storing information held by the battery pack,
wherein the battery diagnosis device is configured to write the information stored in the storage unit to a second battery pack that is different from the battery pack when the second battery pack is mounted on the adaptor.

2. The battery diagnosis device according to claim 1, wherein the battery diagnosis device is configured to write the information stored in the storage unit to the different battery pack when the diagnosed battery pack is to be guaranteed.

3. The battery diagnosis device according to claim 2, wherein the information includes battery information including a nominal battery voltage of the battery pack and number-of-times information including the number of uses of the battery pack, and
wherein the battery diagnosis device is configured to determine whether the battery pack is to be guaranteed based on the number-of-times information.

4. The battery diagnosis device according to claim 3, wherein the battery diagnosis device is configured to guarantee the battery pack when the number of uses is equal to or smaller than a predetermined number of times.

5. The battery diagnosis device according to claim 1, wherein the battery diagnosis device is configured to disable use of the battery pack when the battery pack is diagnosed to be guaranteed.

6. The battery diagnosis device according to claim 1, wherein the battery diagnosis device is configured to disable use of the battery pack, which is returned from a user to a manager.

7. The battery diagnosis device according to claim 1, wherein the information includes the number of times of charging the battery pack, and
wherein the battery diagnosis device is configured to guarantee the battery pack when the number of times of charging the battery pack is equal to or smaller than a predetermined value.

8. A battery diagnosis system comprises:
a first battery pack having a first storage unit storing an information of the first battery pack;
a second battery pack having a second storage unit;
an adaptor having a mounting unit on which one of the first battery pack and the second battery pack is selectively mounted; and
a computer device having a third storage unit and connectable to the adaptor,
wherein the computer device is configured to:
write the information stored the first storage of the first battery pack to the third storage unit of the computer device when the first battery pack is mounted on the mounting unit of the adaptor, and thereafter
write the information written the third storage unit of the computer device to the second storage unit of the second battery pack when the second battery pack is mounted on the mounting unit of adaptor.

9. The battery diagnosis system according to claim 8, wherein the computer device is configured to write the information stored the third storage unit of the computer device to the second storage unit of the second battery pack when the first battery pack is to be a guaranteed.

* * * * *